United States Patent
Kito et al.

(10) Patent No.: US 8,400,842 B2
(45) Date of Patent: Mar. 19, 2013

(54) NONVOLATILE SEMICONDUCTOR MEMORY DEVICE AND METHOD FOR DRIVING THE SAME

(75) Inventors: Masaru Kito, Kanagawa-ken (JP); Tomoko Fujiwara, Kanagawa-ken (JP); Yoshimasa Mikajiri, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 173 days.

(21) Appl. No.: 13/018,786

(22) Filed: Feb. 1, 2011

(65) Prior Publication Data
US 2011/0188321 A1    Aug. 4, 2011

(30) Foreign Application Priority Data
Feb. 2, 2010   (JP) .................................. 2010-021656

(51) Int. Cl.
*G11C 11/34* (2006.01)
(52) U.S. Cl. .............................. 365/185.29; 365/185.24
(58) Field of Classification Search ............. 365/185.29, 365/185.24
See application file for complete search history.

(56) References Cited

U.S. PATENT DOCUMENTS

| | | | |
|---|---|---|---|
| 8,154,072 B2 * | 4/2012 | Koike et al. | 257/322 |
| 2008/0144377 A1 * | 6/2008 | Watanabe et al. | 365/185.05 |
| 2009/0052255 A1 * | 2/2009 | Moon et al. | 365/185.19 |
| 2010/0008150 A1 * | 1/2010 | Hazama | 365/185.22 |
| 2010/0207195 A1 | 8/2010 | Fukuzumi et al. | |

FOREIGN PATENT DOCUMENTS

JP      2007-320215      12/2007

* cited by examiner

*Primary Examiner* — Michael Tran
(74) *Attorney, Agent, or Firm* — Oblon, Spivak, McClelland, Maier & Neustadt, L.L.P.

(57) ABSTRACT

According to one embodiment, a nonvolatile semiconductor memory device includes a memory unit and a control unit. The memory unit includes a charge storage film, a first insulating film provided adjacent to one surface of the charge storage film, a second insulating film provided adjacent to one other surface of the charge storage film, a semiconductor portion provided adjacent to the first insulating film and a plurality of electrode portions provided adjacent to the second insulating film. The control unit performs a control of applying a first voltage to electrode portions adjacent to each other in one direction at different timing respectively, in an erasing. The erasing is performed by at least one selected from injecting electron holes into the charge storage film and removing electrons from the charge storage film. The first voltage is applied from one of the electrode portions to the charge storage film to be erased.

14 Claims, 9 Drawing Sheets

NONVOLATILE SEMICONDUCTOR MEMORY DEVICE AND METHOD FOR DRIVING THE SAME

CROSS-REFERENCE TO RELATED APPLICATIONS

This application is based upon and claims the benefit of priority from the prior Japanese Patent Application No. 2010-021656, filed on Feb. 2, 2010; the entire contents of which are incorporated herein by reference.

FIELD

Embodiments described herein relate generally to a nonvolatile semiconductor memory device and a method for driving the same.

BACKGROUND

Conventional LSI (Large Scale Integration) integrates elements in a two-dimensional plane on a silicon substrate. It is necessary to reduce the dimensions of one element (downscale) to increase the storage capacity in semiconductor memory devices (memory). However, in recent years, such downscaling has become difficult in regard to both technology and cost.

Although improvements to photolithography technology are necessary to downscale, current ArF immersion lithography has reached resolution limits at about the 40 nm rule; and it is necessary to introduce EUV (Extreme Ultra Violet) exposure apparatuses for further downscaling.

However, the introduction of EUV exposure apparatuses is not realistic due to extremely high costs. Moreover, even in the case where such downscaling could be achieved, unless the drive voltages and the like can be scaled, it is expected that physical limitations such as the breakdown voltage between elements will be reached.

Therefore, many ideas for three-dimensional memory have been proposed. However, because general three-dimensional memory devices require processes including at least three lithography processes for each layer, costs have not been reduced even with three dimensional structures; and stacking four or more layers may undesirably lead to higher costs.

The inventors of the application have proposed collectively patterned three-dimensionally stacked memory cells in consideration of such problems (for example, refer to JP-A 2007-320215 (Kokai)). According to such a method, it is possible to suppress cost increases because it is possible to form a stacked memory collectively regardless of the number of stacks.

Such three-dimensional collectively patterned memory capable of suppressing cost increases employs a MONOS (Metal Oxide Nitride Oxide Semiconductor) transistor as the memory cell.

Therefore, the proposed three-dimensional collectively patterned memory uses operations similar to those of conventional NAND flash memory. However, the memory cell portion employs not a structure having a floating gate but a so-called MONOS cell in which charge is programmed into a charge trap insulating film.

Further, due to the collective patterning processes, the MONOS insulating film is formed uniformly on the side wall of holes and is formed as a continuous film not only at the cell portions but also at inter-layer film portions between cells (hereinbelow also referred to as "between CG-CG"). Therefore, there is a risk of data retention deterioration due to the programmed charge moving due to effects from adjacent cells.

Such effects from adjacent cells have a relationship with the repeated programming and erasing of data. In other words, it is considered that a load accumulates in the MONOS insulating film between adjacent cells due to the repeated operations of programming and erasing data.

DETAILED DESCRIPTION

Figures 1A, 1B:
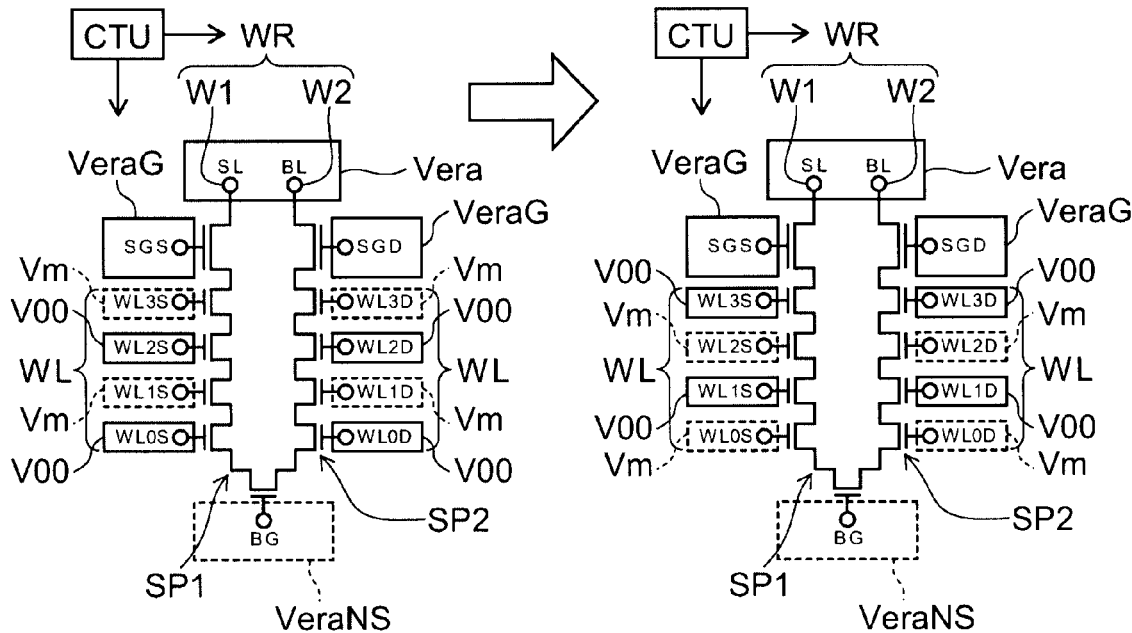
FIGS. 1A to 1D are schematic views illustrating a nonvolatile semiconductor memory device according to this embodiment.

In general, according to one embodiment, a nonvolatile semiconductor memory device includes a memory unit and a control unit. The memory unit includes a charge storage film, a first insulating film provided adjacent to one surface of the charge storage film, a second insulating film provided adjacent to one other surface of the charge storage film, a semiconductor portion provided adjacent to the first insulating film and a plurality of electrode portions provided adjacent to the second insulating film. The control unit performs a control of applying a first voltage to electrode portions adjacent to each other in one direction at different timing respectively, when performing an erasing operation. The erasing operation is performed by performing at least one selected from injecting electron holes into the charge storage film and removing electrons from the charge storage film. The first voltage is applied from one of the electrode portions to the charge storage film to be erased.

In general, according to another embodiment, a method for driving a nonvolatile semiconductor memory device is disclosed. The device includes a charge storage film, a first insulating film provided adjacent to one surface of the charge storage film, a second insulating film provided adjacent to one other surface of the charge storage film, a semiconductor portion provided adjacent to the first insulating film and a plurality of electrode portions provided adjacent to the second insulating film. The method can include applying a first voltage to electrode portions adjacent to each other in one direction at different timing respectively, when performing an erasing operation. The erasing operation is performed by performing at least one selected from injecting electron holes into the charge storage film and removing electrons from the charge storage film. The first voltage is applied from one of the electrode portions to the charge storage film to be erased.

Embodiments of the invention will now be described with reference to the drawings.

The drawings are schematic or conceptual; and the relationships between the thicknesses and widths of portions, the proportional coefficients of sizes among portions, etc., are not necessarily the same as the actual values thereof. Further, the dimensions and the proportional coefficients may be illustrated differently among the drawings, even for identical portions. In the specification and the drawings of the application, components similar to those described in regard to a drawing thereinabove are marked with like reference numerals, and a detailed description is omitted as appropriate.

FIGS. 1A to 1D are schematic views illustrating a nonvolatile semiconductor memory device according to this embodiment.

Figure 1C:
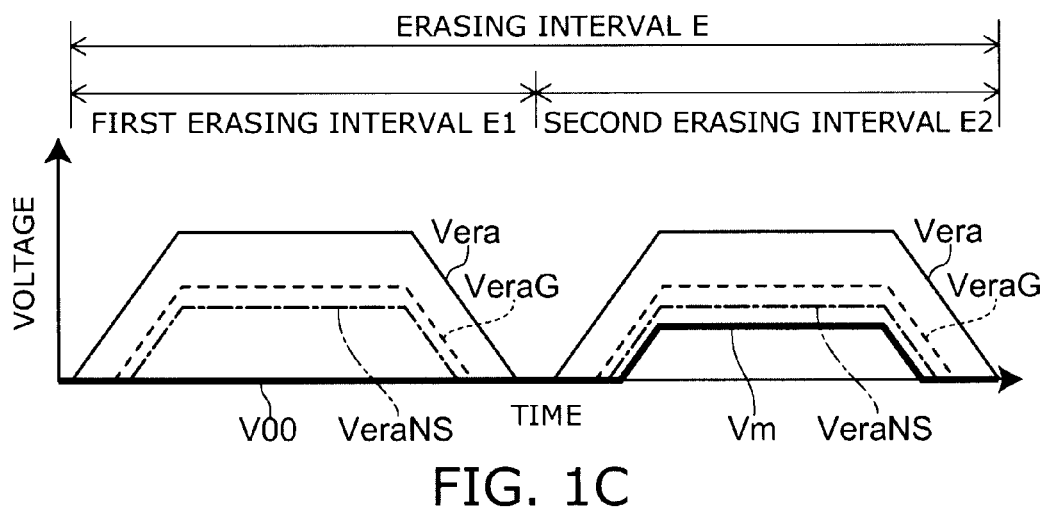
Figure 1D:
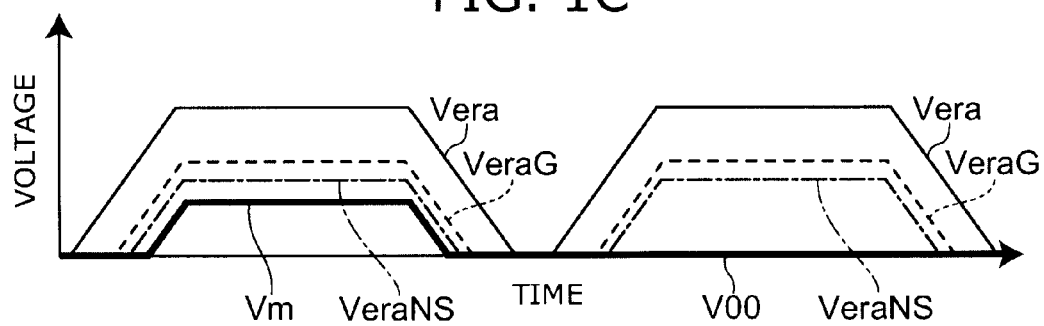

Namely, FIGS. 1A and 1B illustrate states of the voltage applied to an electrode film WL described below; and FIG. 1C and FIG. 1D illustrate the application timing corresponding to the voltage applications of FIG. 1A and FIG. 1B, respectively.

Figure 2:
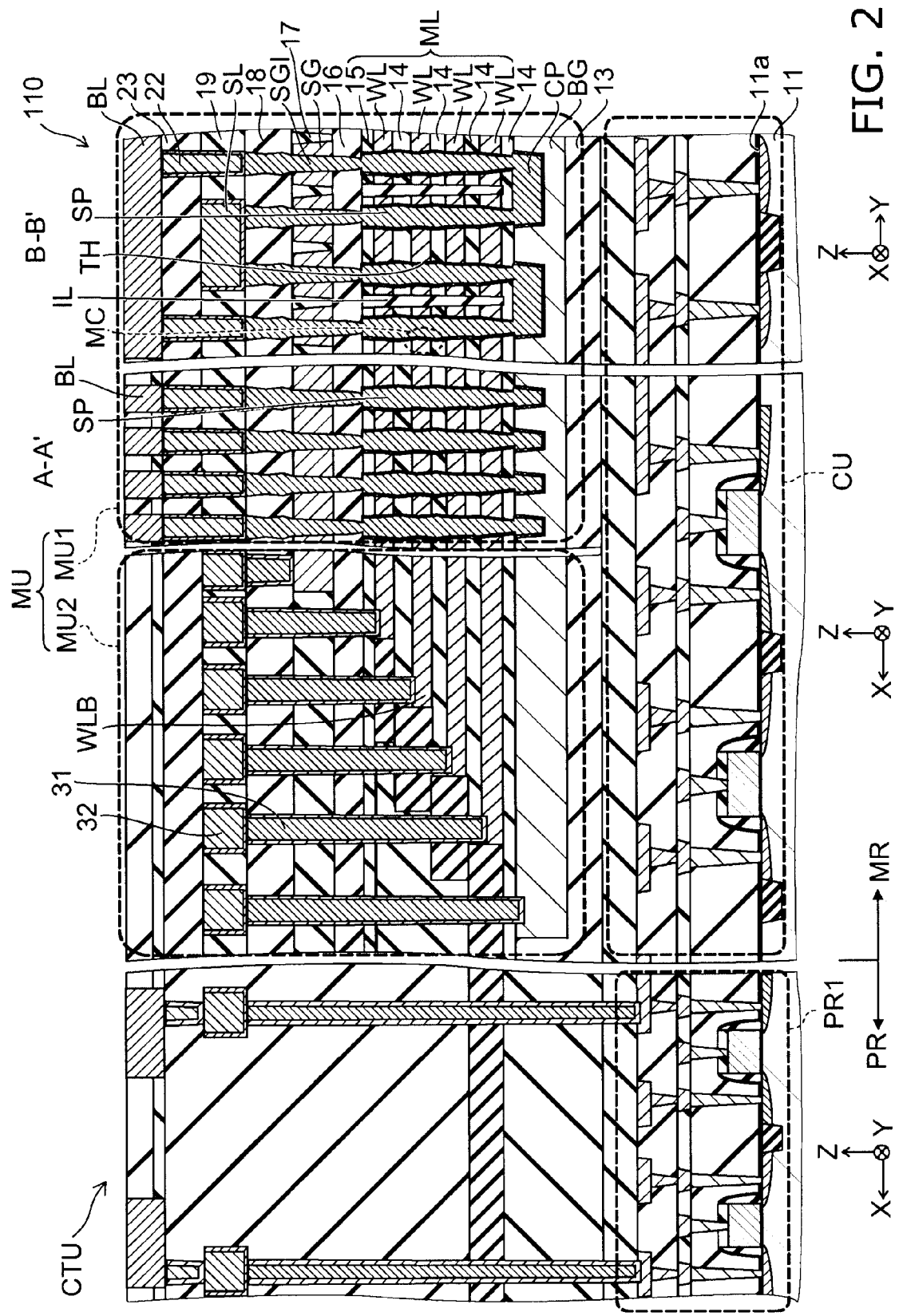
FIG. 2 is a schematic cross-sectional view illustrating the overall configuration of the nonvolatile semiconductor memory device according to this embodiment.

FIG. 2 is a schematic cross-sectional view illustrating the overall configuration of the nonvolatile semiconductor memory device according to this embodiment.

Figure 3:
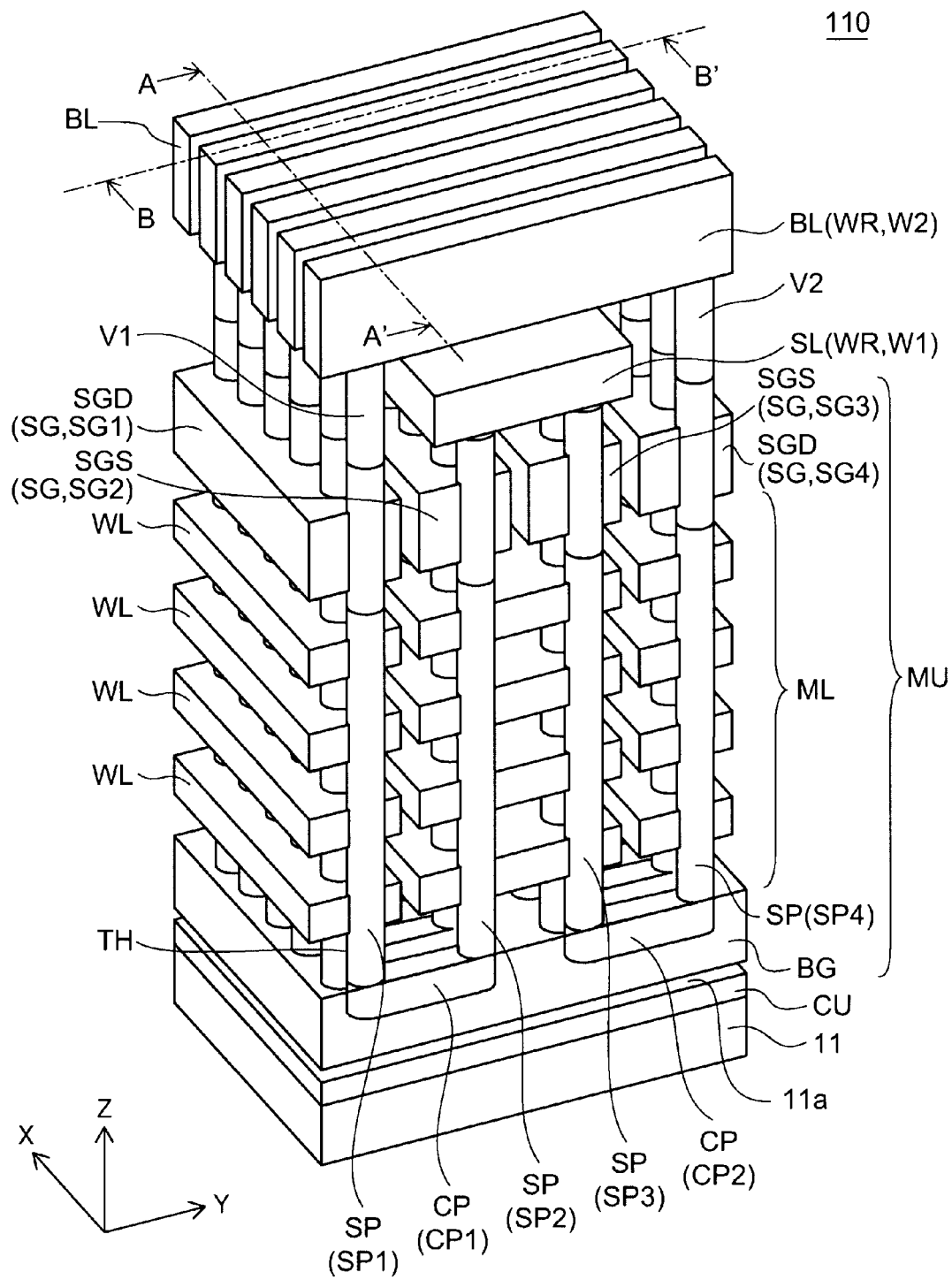
FIG. 3 is a schematic perspective view illustrating the configuration of the nonvolatile semiconductor memory device according to this embodiment.

FIG. 3 is a schematic perspective view illustrating the configuration of the nonvolatile semiconductor memory device according to this embodiment.

For easier viewing of the drawing in FIG. 3, only the conductive portions are illustrated, and the insulating portions are omitted.

Figure 4:
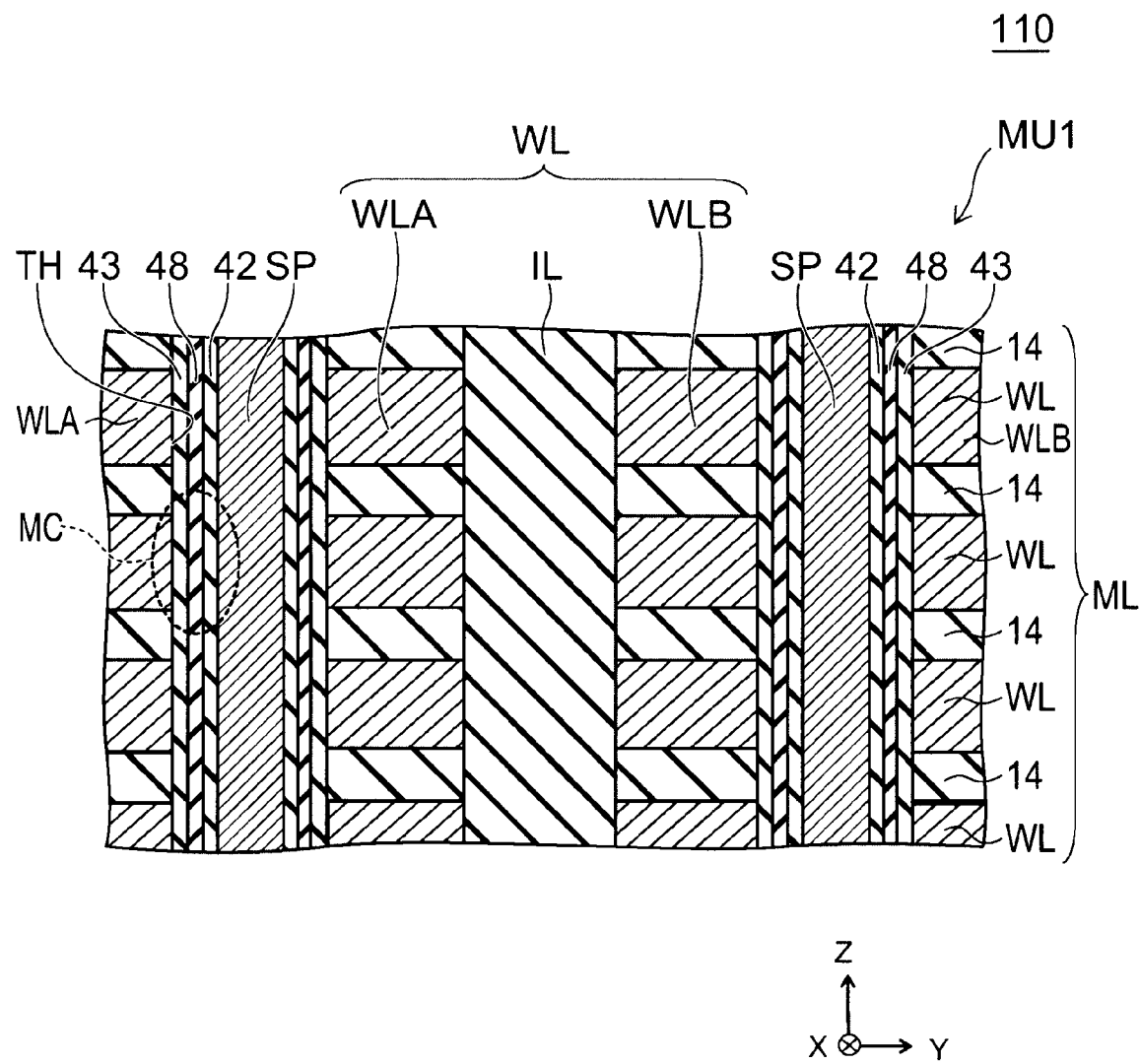
FIG. 4 is a schematic cross-sectional view illustrating the configuration of a portion of the nonvolatile semiconductor memory device according to this embodiment.

FIG. 4 is a schematic cross-sectional view illustrating the configuration of a portion of the nonvolatile semiconductor memory device according to this embodiment.

Figure 5:
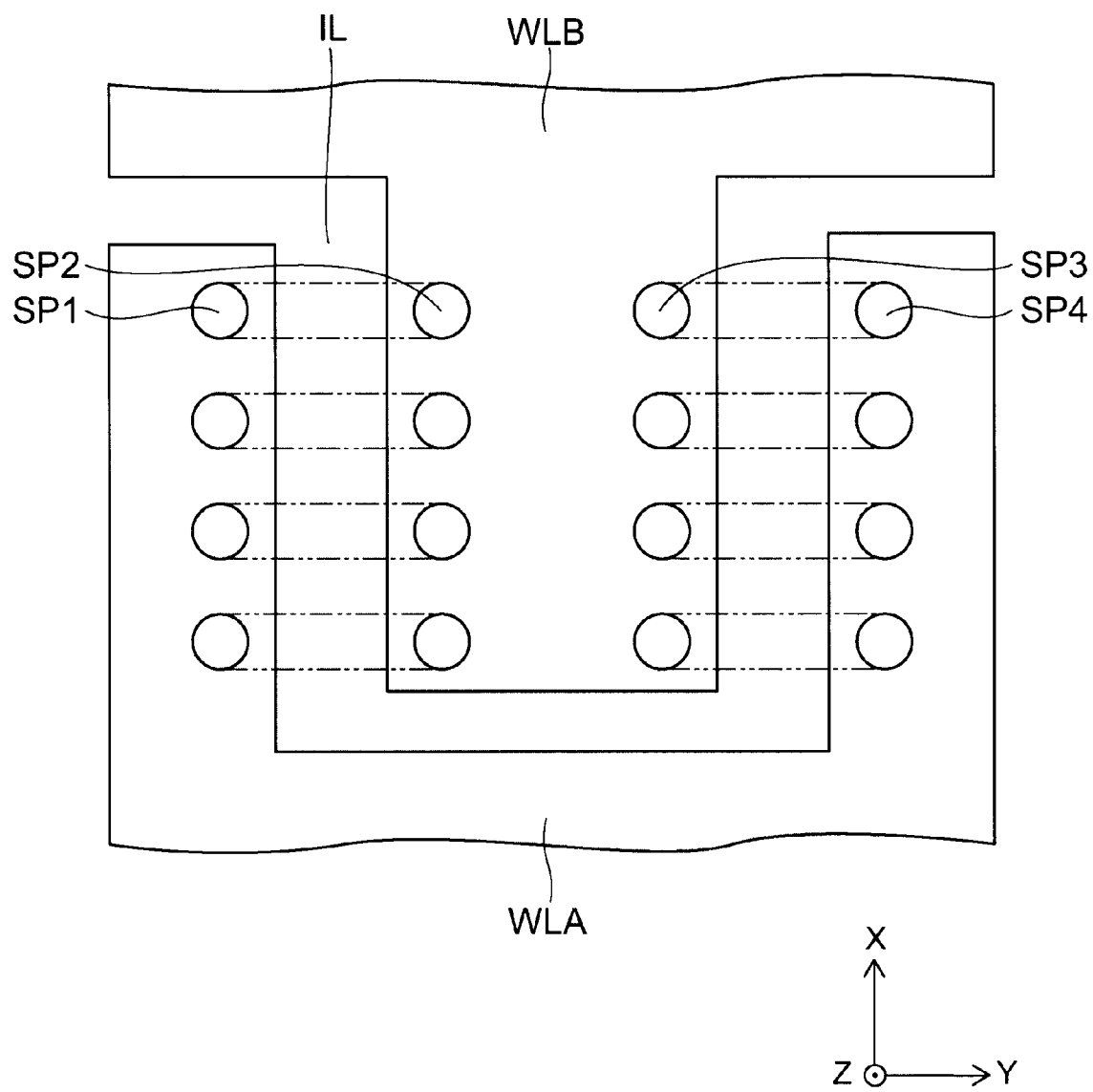
FIG. 5 is a schematic plan view illustrating the configuration of electrode films of the nonvolatile semiconductor memory device according to this embodiment.

FIG. 5 is a schematic plan view illustrating the configuration of electrode films of the nonvolatile semiconductor memory device according to this embodiment.

The nonvolatile semiconductor memory device 110 according to the embodiment of the invention is a three-dimensionally stacked flash memory.

First, an overview of the configuration of the nonvolatile semiconductor memory device 110 will be described using FIG. 2 to FIG. 5.

As illustrated in FIG. 2, the nonvolatile semiconductor memory device 110 includes a memory unit MU.

The nonvolatile semiconductor memory device 110 may further include a control unit CTU. The memory unit MU and the control unit CTU are provided on a major surface 11a of a semiconductor substrate 11 made of, for example, monocrystalline silicon. However, the control unit CTU may be provided on a substrate separate from the substrate on which the memory unit MU is provided. Hereinbelow, the case is described where the memory unit MU and the control unit CTU are provided on the same substrate (the semiconductor substrate 11).

For example, a memory array region MR, in which memory cells MC are provided, and a peripheral region PR are set in the semiconductor substrate 11. The peripheral region PR is provided in, for example, the periphery of the memory array region MR. In the peripheral region PR, various peripheral region circuits PR1 are provided on the semiconductor substrate 11.

In the memory array region MR, a circuit unit CU, for example, is provided on the semiconductor substrate 11; and the memory unit MU is provided on the circuit unit CU. The circuit unit CU is provided as necessary and may be omitted. An inter-layer insulating film 13 made of, for example, silicon oxide is provided between the circuit unit CU and the memory unit MU.

At least a portion of the control unit CTU may be provided, for example, in at least one selected from the peripheral region circuit PR1 and the circuit unit CU recited above.

The memory unit MU includes a matrix memory cell unit MU1 including multiple memory cell transistors and an inter-connect connection unit MU2 that connects the interconnects of the matrix memory cell unit MU1.

FIG. 3 illustrates the configuration of the matrix memory cell unit MU1.

Namely, a portion of the cross section along A-A' of FIG. 3 and a portion of the cross section along line B-B' of FIG. 3 are illustrated as the matrix memory cell unit MU1 in FIG. 2.

As illustrated in FIG. 2 and FIG. 3, a stacked structural body ML is provided on the major surface 11a of the semiconductor substrate 11 in the matrix memory cell unit MU1. The stacked structural body ML includes multiple electrode films (electrode portions) WL and multiple inter-electrode insulating films 14 stacked alternately in a direction perpendicular to the major surface 11a.

In specification of the application, an XYZ orthogonal coordinate system is introduced for convenience of description. In this coordinate system, a direction perpendicular to the major surface 11a of the semiconductor substrate 11 is taken as a Z-axis direction (a first direction). One direction in a plane parallel to the major surface 11a is taken as a Y-axis direction (a second direction). A direction perpendicular to the Z axis and the Y axis is taken as an X-axis direction (a third direction).

The stacking direction of the electrode film WL and the inter-electrode insulating film 14 of the stacked structural body ML is the Z-axis direction. In other words, the electrode film WL and the inter-electrode insulating film 14 are provided parallel to the major surface 11a. The electrode film WL is divided into, for example, erasing block units.

FIG. 4 illustrates the configuration of the matrix memory cell unit MU1 and corresponds to, for example, a portion of the cross section along line B-B' of FIG. 3.

As illustrated in FIG. 3 and FIG. 4, the memory unit MU of the nonvolatile semiconductor memory device 110 includes the stacked structural body ML recited above, a semiconductor pillar SP (a first semiconductor pillar SP1) which is a semiconductor portion piercing the stacked structural body ML in the Z-axis direction, a charge storage film 48, an inner insulating film (a first insulating film) 42, an outer insulating film (a second insulating film) 43, and an interconnect WR.

The charge storage film 48 is provided between the semiconductor pillar SP and each of the electrode films WL. The inner insulating film 42 is provided between the charge storage film 48 and the semiconductor pillar SP. The outer insulating film 43 is provided between the charge storage film 48 and each of the electrode films WL. The interconnect WR is electrically connected to the one end of the semiconductor pillar SP.

In other words, the outer insulating film 43, the charge storage film 48, and the inner insulating film 42 are formed in this order on the wall face of the interior of a through-hole TH piercing the stacked structural body ML in the Z-axis direction; and the semiconductor pillar SP is formed by filling a semiconductor into the remaining space.

The memory cells MC are provided at the intersections between the electrode films WL and the semiconductor pillars SP of the stacked structural body ML. In other words, the memory cell transistors including the charge storage film 48 are provided at the portions where the electrode films WL and the semiconductor pillars SP intersect in a three-dimensional matrix configuration; and the memory cell transistors function as the memory cells MC that store data by storing charge in the charge storage film 48. Accordingly, memory layers 4 of the memory cells MC at the positions of the electrode films WL function as memory regions; and multiple memory regions are provided along the extension direction of the charge storage film 48.

The inner insulating film 42 functions as a tunneling insulating film of the memory cell transistor of the memory cell MC. On the other hand, the outer insulating film 43 functions as a blocking insulating film of the memory cell transistor of the memory cell MC. The inter-electrode insulating film 14 functions as an inter-layer insulating film that insulates the electrode films WL from each other.

The electrode film WL may include any conductive material. For example, amorphous silicon or polysilicon provided with a conductivity by introducing an impurity may be used; and metals, alloys, etc., also may be used. A prescribed electrical signal is applied to the electrode film WL; and the electrode film WL functions as a word line of the nonvolatile semiconductor memory device 110.

The inter-electrode insulating film 14, the inner insulating film 42, and the outer insulating film 43 may include, for example, a silicon oxide film. The inter-electrode insulating film 14, the inner insulating film 42, and the outer insulating film 43 may be single-layer films or may be stacked films.

The charge storage film 48 may include, for example, a silicon nitride film and functions as a portion that stores information by storing or emitting charge by an electric field applied between the semiconductor pillar SP and the electrode film WL. The charge storage film 48 may be a single-layer film or a stacked film.

As described below, the inter-electrode insulating film 14, the inner insulating film 42, the charge storage film 48, and the outer insulating film 43 are not limited to the materials illustrated above; and any material may be used.

Although the case is illustrated in FIG. 2 and FIG. 3 where the stacked structural body ML includes four electrode film WL layers, the number of electrode films WL provided in the stacked structural body ML is arbitrary. Hereinbelow, the case of four electrode films WL is described.

In this specific example, two of the semiconductor pillars SP are connected by a connection portion CP (a connection portion semiconductor layer).

In other words, the memory unit MU further includes a second semiconductor pillar SP2 (the semiconductor pillar SP) and a first connection portion CP1 (the connection portion CP).

The second semiconductor pillar SP2 is adjacent to the first semiconductor pillar SP1 (the semiconductor pillar SP), for example, in the Y-axis direction to pierce the stacked structural body ML in the Z-axis direction. The first connection portion CP1 electrically connects the first semiconductor pillar SP1 and the second semiconductor pillar SP2 at the same Z-axis direction side (the semiconductor substrate 11 side). The first connection portion CP1 is provided to extend in the Y-axis direction. The first connection portion CP1 may include the same material as the first and second semiconductor pillars SP1 and SP2.

In other words, a back gate BG (a connection portion conductive layer) is provided on the major surface 11a of the semiconductor substrate 11 with the inter-layer insulating film 13 interposed therebetween. A trench CTR is provided in the portion of the back gate BG opposing the first and second semiconductor pillars SP1 and SP2; the outer insulating film 43, the charge storage film 48, and the inner insulating film 42 are formed in the interior of the trench CTR; and the connection portion CP made of a semiconductor is filled into the remaining space. The formation of the outer insulating film 43, the charge storage film 48, the inner insulating film 42, and the connection portion CP in the trench recited above may be performed collectively and simultaneously with the formation of the outer insulating film 43, the charge storage film 48, the inner insulating film 42, and the semiconductor pillar SP in the through-hole TH. Thus, the back gate BG is provided to oppose the connection portion CP.

Thereby, a semiconductor pillar having a U-shaped configuration is formed of the first and second semiconductor pillars SP1 and SP2 and the connection portion CP to form a NAND string having a U-shaped configuration.

Although the connection portion CP includes the function of electrically connecting the first and second semiconductor pillars SP1 and SP2, the connection portion CP also may be utilized as one memory cell. Thereby, more memory bits can be provided. Hereinbelow, the case is described where the connection portion CP electrically connects the first and second semiconductor pillars SP1 and SP2 and is not used as a memory portion. In such a case, although the charge storage film 48 opposing the connection portion CP does not function as a memory portion, the portion of the charge storage film 48 opposing the connection portion CP also is referred to as "a memory layer" to simplify the description.

As illustrated in FIG. 2 and FIG. 3, the end of the first semiconductor pillar SP1 opposite to the first connection portion CP1 is connected to a bit line BL (a second interconnect W2); and the end of the second semiconductor pillar SP2 opposite to the first connection portion CP1 is connected to a source line SL (a first interconnect W1). The semiconductor pillar SP and the bit line BL are connected by a via V1 and a via V2. The interconnect WR includes the first interconnect W1 and the second interconnect W2.

In this specific example, the bit line BL extends in the Y-axis direction; and the source line SL extends in the X-axis direction.

Between the stacked structural body ML and the bit line BL, a drain-side selection gate electrode SGD (a first selection gate electrode SG1, i.e., the selection gate electrode SG) is provided to oppose the first semiconductor pillar SP1; and a source-side selection gate electrode SGS (a second selection gate electrode SG2, i.e., the selection gate electrode SG) is provided to oppose the second semiconductor pillar SP2. Thereby, the desired data can be programmed to or read from any memory cell MC of any semiconductor pillar SP.

The selection gate electrode SG may include any conductive material. For example, polysilicon or amorphous silicon may be used. In this specific example, the selection gate electrode SG is divided in the Y-axis direction and has a band configuration extending along the X-axis direction.

As illustrated in FIG. 2, an inter-layer insulating film 15 is provided in the uppermost portion (the side most distal to the semiconductor substrate 11) of the stacked structural body ML. An inter-layer insulating film 16 is provided on the stacked structural body ML; the selection gate electrode SG is provided thereon; and an inter-layer insulating film 17 is provided between the selection gate electrodes SG. A through-hole is provided in the selection gate electrode SG; a selection gate insulating film SGI of the selection gate transistor is provided on an inner side face thereof; and a semiconductor is filled therein. This semiconductor continues from the semiconductor pillar SP. In other words, the memory unit MU further includes the selection gate electrode SG stacked on the stacked structural body ML in the Z-axis direction and pierced by the semiconductor pillar SP at the interconnect WR (at least one selected from the source line SL and the bit line BL) side.

An inter-layer insulating film 18 is provided on the inter-layer insulating film 17; the source line SL and a via 22 (the vias V1 and V2) are provided thereon; and an inter-layer insulating film 19 is provided around the source line SL. An inter-layer insulating film 23 is provided on the source line SL; and the bit line BL is provided thereon. The bit line BL has a band configuration along the Y-axis direction.

The inter-layer insulating films 15, 16, 17, 18, 19, and 23 and the selection gate insulating film SGI may include, for example, silicon oxide.

Herein, the semiconductor pillar is multiply provided in the nonvolatile semiconductor memory device 110. "Semiconductor pillar SP" is used to refer to all of the semiconductor pillars or any semiconductor pillar; and "nth semiconductor pillar SPn" (n being any integer not less than 1) is used to refer to a designated semiconductor pillar when describing a relationship between semiconductor pillars, etc.

For the electrode films WL as illustrated in FIG. 5, the electrode films corresponding to the semiconductor pillars SP (4 m+1) and SP (4 m+4) have a common connection to form an electrode film WLA, where m is an integer not less than 0 and n is (4 m+1) and (4 m+4); and the electrode films corresponding to the semiconductor pillars SP (4 m+2) and SP (4 m+3) have a common connection to form an electrode film WLB, where n is (4 m+2) and (4 m+3). In other words, the electrode films WL have a configuration in which the electrode film WLA and the electrode film WLB are combined with each other in a comb teeth configuration opposing in the X-axis direction.

As illustrated in FIG. 4 and FIG. 5, the electrode film WL is divided by an insulating layer IL; and the electrode film WL is divided into a first region (the electrode film WLA) and a second region (the electrode film WLB).

As in the interconnect connection unit MU2 illustrated in FIG. 2, the electrode film WLB is connected at one X-axis direction end to a word interconnect 32 by a via plug 31 and is electrically connected to, for example, a drive circuit provided in the semiconductor substrate 11. Similarly, the electrode film WLA is connected at the other X-axis direction end to the word interconnect by the via plug and is electrically connected to the drive circuit. In other words, the length in the X-axis direction of each of the electrode films WL (the electrode film WLA and the electrode film WLB) stacked in the Z-axis direction changes in a stairstep configuration; and the electrode films WL are electrically connected to the drive circuit by the electrode film WLA at the one X-axis direction end and by the electrode film WLB at the other X-axis direction end.

As illustrated in FIG. 3, the memory unit MU may further include a third semiconductor pillar SP3 (the semiconductor pillar SP), a fourth semiconductor pillar SP4 (the semiconductor pillar SP), and a second connection portion CP2 (the connection portion CP).

The third semiconductor pillar SP3 is adjacent to the second semiconductor pillar SP2 in the Y-axis direction on the side of the second semiconductor pillar SP2 opposite to the first semiconductor pillar SP1 and pierces the stacked structural body ML in the Z-axis direction. The fourth semiconductor pillar SP4 is adjacent to the third semiconductor pillar SP3 in the Y-axis direction on the side of the third semiconductor pillar SP3 opposite to the second semiconductor pillar SP2 and pierces the stacked structural body ML in the Z-axis direction.

The second connection portion CP2 electrically connects the third semiconductor pillar SP3 and the fourth semiconductor pillar SP4 on the same side (the same side as the first connection portion CP1) in the Z-axis direction. The second connection portion CP2 is provided to extend in the Y-axis direction to oppose the back gate BG.

The charge storage film 48 is provided between the third semiconductor pillar SP3 and each of the electrode films WL, between the fourth semiconductor pillar SP4 and each of the electrode films WL, and between the back gate BG and the second connection portion CP2 as well. The inner insulating film 42 is provided between the third semiconductor pillar SP3 and the charge storage film 48, between the fourth semiconductor pillar SP4 and the charge storage film 48, and between the charge storage film 48 and the second connection portion CP2 as well. The outer insulating film 43 is provided between the charge storage film 48 and each of the electrode films WL and between the charge storage film 48 and the back gate BG.

The source line SL is connected to a third end portion of the third semiconductor pillar SP3 on the side opposite to the second connection portion CP2. The bit line BL is connected to a fourth end portion of the fourth semiconductor pillar SP4 on the side opposite to the second connection portion CP2.

The source-side selection gate electrode SGS (a third selection gate electrode SG3, i.e., the selection gate electrode SG) is provided to oppose the third semiconductor pillar SP3. The drain-side selection gate electrode SGD (a fourth selection gate electrode SG4, i.e., the selection gate electrode SG) is provided to oppose the fourth semiconductor pillar SP4.

Driving Method: The Erasing Operation

The erasing operation of the nonvolatile semiconductor memory device 110 according to this embodiment will now be described. The erasing operation is an operation of performing at least one selected from injecting electron holes into the charge storage film 48 and removing electrons from the charge storage film 48.

The memory cell transistor forming the memory cell MC has a low threshold state (an erase state) and a threshold state relatively higher than the low threshold state (a program state). The erasing operation is an operation of setting the threshold of the memory cell transistor to the low side.

The programming operation is an operation of performing at least one selected from injecting electrons into the charge storage film 48 and removing electron holes from the charge storage film 48. In other words, the programming operation is an operation of setting the threshold of the memory cell transistor to the high side.

When performing one operation of erasing the information stored in the memory regions of the multiple memory cells MC provided in the continuous charge storage film 48 in the nonvolatile semiconductor memory device 110 according to this embodiment, the control unit CTU (referring to FIG. 2) performs a control of applying the voltage applied to the memory regions to be erased from the electrode film WL to mutually adjacent electrode films WL at different timing respectively. Here, adjacent electrode films WL refers to electrode films WL adjacent to each other in one direction (e.g., the Z-axis direction) of the directions in which the charge storage film 48 extends (a direction along the major surface of the charge storage film 48).

For the multiple electrode films WL of one semiconductor pillar (SP1 or SP2) in the example illustrated in FIGS. 1A to 1D, the voltage applied in the erasing is applied from the adjacent electrode films WL of the same semiconductor pillar at different timing.

For example, for electrode films WL0S, WL1S, WL2S, and WL3S corresponding to the first semiconductor pillar SP1, the voltage to select the memory cells to be erased is applied from one group of every other electrode film WL0S and WL2S (referring to FIG. 1A) and from one other group of every other electrode film WL1S and WL3S (referring to FIG. 1B) at different timing respectively.

Also, for the electrode films WL0D, WL1D, WL2D, and WL3D corresponding to the second semiconductor pillar SP2, the voltage to select the memory cells to be erased is applied from one group of every other electrode film WL0D and WL2D (referring to FIG. 1A) and from one other group of every other electrode film WL1D and WL3D (referring to FIG. 1B) at different timing respectively.

Here, in the nonvolatile semiconductor memory device 110, the control unit CTU applies an erasing back gate voltage VeraNS having a positive polarity to the back gate BG in the erasing operation (the operation of performing the at least one selected from injecting electron holes into the charge storage film 48 and removing electrons from the charge storage film 48).

In the nonvolatile semiconductor memory device 110, the channel layers (the semiconductor pillar SP and the connection portion CP) are not connected to the semiconductor substrate 11. Therefore, the potential of the channel layers can be increased by, for example, generating a GIDL (Gate-Induced-Drain-Leakage) current in the end portion of the selection gate electrode SG and by transferring the electron holes generated thereby into the channel layer interior.

In the erasing operation, the control unit CTU sets the electrode films WL of the memory cells to be erased to the first voltage, e.g., a grounding potential GND (i.e., a reference potential V00, e.g., 0 volts) and applies an erasing voltage Vera, which is a voltage having a positive polarity when referenced to the reference potential V00, to the interconnect WR.

When applying the grounding potential GND (the reference potential V00) to the electrode films WL of the memory cells, the control unit CTU shifts the timing of the application to the one group of every other electrode film WL0S and WL2S and the one group of every other electrode film WL0D and WL2D from the timing of the application to the one other group of every other electrode film WL1S and WL3S and the one other group of every other electrode film WL1D and WL3D. That is, the reference potential V00 is not applied to the electrode films WL0S, WL2S, WL0D, and WL2D simultaneously with the electrode films WL1S, WL3S, WL1D, and WL3D.

FIGS. 1C and 1D illustrate the timing of the voltage application.

FIG. 1C illustrates the timing of the reference potential V00 applied to the one group of every other electrode film WL0S and WL2S and the one group of every other electrode film WL0D and WL2D and illustrates the temporal change from the state illustrated in FIG. 1A to the state illustrated in FIG. 1B. FIG. 1D illustrates the timing of the reference potential V00 applied to the one other group of every other electrode film WL1S and WL3S and the one other group of every other electrode film WL1D and WL3D and illustrates the temporal change from the state illustrated in FIG. 1A to the state illustrated in FIG. 1B. Both drawings are illustrated referring to the erasing voltage Vera, an erasing selection gate voltage VeraG, and the erasing back gate voltage VeraNS.

In the description hereinbelow, the interval in which the erasing operation is performed once for all of the memory regions of the multiple memory cells provided in one continuous charge storage film 48 is referred to as an erasing interval E; the interval in which the erasing operation is performed for the memory regions corresponding to the one group of every other electrode film WL0S and WL2S and the one group of every other electrode film WL0D and WL2D is referred to as a first erasing interval E1; and the interval in which the erasing operation is performed for the memory regions corresponding to the one other group of every other electrode film WL1S and WL3S and the one other group of every other electrode film WL1D and WL3D is referred to as a second erasing interval E2.

First, the first erasing interval E1 will be described.

As illustrated in the first erasing interval E1 side of FIG. 1C, the control unit CTU applies the erasing voltage Vera to the interconnect WR. Slightly later than the application start of the erasing voltage Vera, the control unit CTU applies the erasing selection gate voltage VeraG, which is a voltage having a positive polarity and a maximum value less than the maximum value of the erasing voltage Vera, to the source-side selection gate electrode SGS and the drain-side selection gate electrode SGD. The erasing selection gate voltage VeraG may be applied slightly later than the application start of the erasing voltage Vera or at the same time as the application start of the erasing voltage Vera. Slightly later than the application start of the erasing selection gate voltage VeraG, the control unit CTU applies the erasing back gate voltage VeraNS, which is a voltage having a positive polarity and a maximum value less than that of the erasing selection gate voltage VeraG, to the back gate BG. The erasing back gate voltage VeraNS may be applied slightly later than the application start of the erasing selection gate voltage VeraG or at the same as the erasing selection gate voltage VeraG. Further, the control unit CTU applies the reference potential V00 to the one group of every other electrode film WL0S and WL2S and the one group of every other electrode film WL0D and WL2D of the memory cells to be erased.

On the other hand, as illustrated in the first erasing interval E1 side of FIG. 1D, the control unit CTU does not apply the reference potential V00 to the one other group of every other electrode film WL1S and WL3S and the one other group of every other electrode film WL1D and WL3D in the first erasing interval E1. Instead, an intermediate potential Vm, which is a voltage greater than the reference potential V00 having a positive polarity and a maximum value less than that of the erasing selection gate voltage VeraG, is applied to the one other group of every other electrode film WL1S and WL3S and the one other group of every other electrode film WL1D and WL3D. The maximum value of the intermediate potential Vm may be the same as or different from the maximum value of the erasing back gate voltage VeraNS. The intermediate potential Vm may be applied slightly later than the application start of the erasing selection gate voltage VeraG or at the same time as the erasing selection gate voltage VeraG.

The electrode films WL1S, WL3S, WL1D, and WL3D which are not to be erased may be floating. In the case of being floating, these are susceptible to disturbance because the potentials are not stable. For example, in the case where the potential of the floating electrode film WL also increases due to coupling as the potential of the semiconductor pillar SP increases, the information of the memory cell is not erased. However, the floating electrode film WL is coupled also to the electrode films WL thereon and thereunder; in the case where the coupling with the electrode films WL is strong, the potential does not increase; and the risk that erasing may occur is slight. Accordingly, it is desirable to perform a control of applying the intermediate potential Vm and the like from the outside to the electrode films WL1S, WL3S, WL1D, and WL3D which are not to be erased so that such erroneous erasing does not occur.

The second erasing interval E2 will now be described.

As illustrated in the second erasing interval E2 side of FIG. 1C, the control unit CTU applies the erasing voltage Vera to the interconnect WR. Slightly later than the application start of the erasing voltage Vera, the control unit CTU applies the erasing selection gate voltage VeraG, which is a voltage having a positive polarity and a maximum value less than the maximum value of the erasing voltage Vera, to the source-side selection gate electrode SGS and the drain-side selection gate electrode SGD. The erasing selection gate voltage VeraG may be applied slightly later than the application start of the erasing voltage Vera or at the same as the erasing voltage Vera. Slightly later than the application start of the erasing selection gate voltage VeraG, the control unit CTU applies the erasing back gate voltage VeraNS, which is a voltage having a positive polarity and a maximum value less than that of the erasing selection gate voltage VeraG, to the back gate BG. The erasing back gate voltage VeraNS may be applied slightly later than the application start of the erasing selection gate voltage VeraG or at the same as the erasing selection gate voltage VeraG. Further, the control unit CTU applies the reference potential V00 to the one other group of every other electrode film WL1S and WL3S and the one other group of every other electrode film WL1D and WL3D of the memory cells to be erased.

On the other hand, as illustrated in the second erasing interval E2 side of FIG. 1D, the control unit CTU does not apply the reference potential V00 to the one group of every other electrode film WL0S and WL2S and the one group of every other electrode film WL0D and WL2D in the second erasing interval E2. Instead, the intermediate voltage Vm, which is a voltage greater than the reference potential V00 having a positive polarity and a maximum value less than that of the erasing selection gate voltage VeraG, is applied to the one group of every other electrode film WL0S and WL2S and the one group of every other electrode film WL0D and WL2D. The maximum value of the intermediate potential Vm may be the same as or different from the maximum value of the erasing back gate voltage VeraNS. The intermediate potential Vm may be applied slightly later than the application start of the erasing selection gate voltage VeraG or at the same as the erasing selection gate voltage VeraG.

Here, although the electrode films WL0S, WL2S, WL0D, and WL2D which are not to be erased may be floating, similarly to the description above, from the viewpoint of preventing erroneous erasing, it is desirable to perform a control of applying the intermediate voltage Vm and the like from the outside.

Thus, the entire erasing interval E made of the first erasing interval E1 and the second erasing interval E2 is in a state in which the reference potential V00 and the intermediate voltage Vm are applied alternately to the electrode films WL adjacent in the Z-axis direction.

Although the erasing interval E is divided into the first erasing interval E1 and the second erasing interval E2 and the reference potential V00 is applied to the one group of every other electrode film WL0S and WL2S and the one group of every other electrode film WL0D and WL2D at timing different from the application to the one other group of every other electrode film WL1S and WL3S and the one other group of every other electrode film WL1D and WL3D in the example recited above, other divisions are possible as long as the control applies the reference potential V00 at different timing to the electrode films WL adjacent in one direction (e.g., the Z-axis direction) in which the charge storage film 48 extends.

For example, groups of every nth electrode film WL (n being an integer not less than 2) in the Z-axis direction may be multiply formed and the reference potential V00 may be applied at different timing for each of the groups; or the reference potential V00 may be applied at different timing for each of the electrode films WL of the multiple memory cells along the Z-axis direction.

From the viewpoint of reducing the erasing interval, it is desirable to perform the division into the two groups of the one group of every other electrode film WL and the one other group of every other electrode film WL in the Z-axis direction as described above and for the control to apply the reference potential V00 to the two groups at different timing respectively.

COMPARATIVE EXAMPLE

Figure 6A:
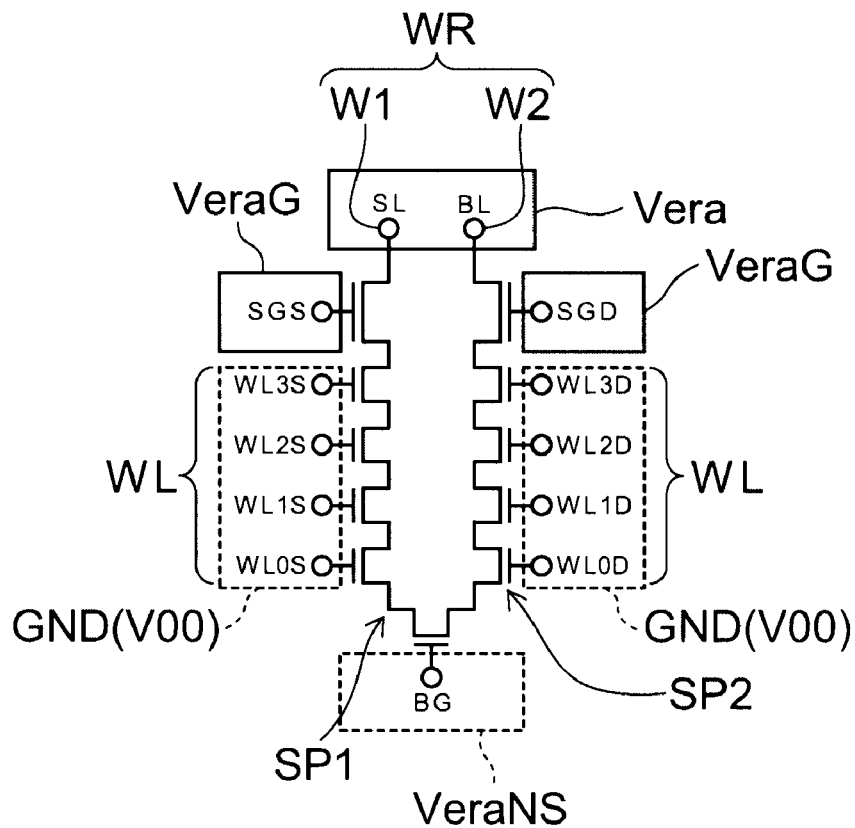
FIG. 6A illustrates the state of the voltage application of the electrode films WL.
Figure 6B:
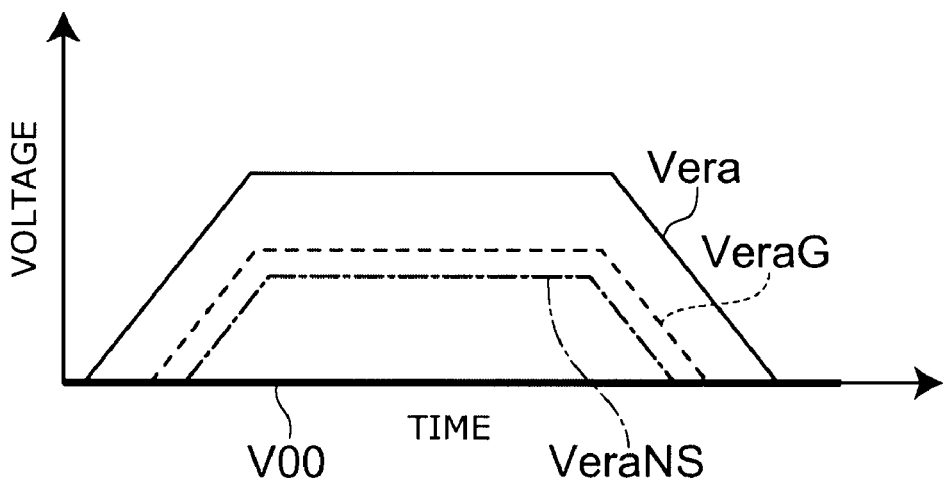
FIG. 6B illustrates the application timing corresponding to the voltage application of FIG. 6A.

FIGS. 6A and 6B illustrate the comparative example. FIG. 6A illustrates the state of the voltage application of the electrode films WL; and FIG. 6B illustrates the application timing corresponding to the voltage application of FIG. 6A. In the erasing operation, the erasing voltage Vera is applied to the interconnect WR; the erasing selection gate voltage VeraG is applied to the drain-side selection gate electrode SGD and the source-side selection gate electrode SGS; and the erasing back gate voltage VeraNS is applied to the back gate BG. The back gate BG has the grounding potential GND (i.e., the reference potential V00) in some cases. The electrode films WL may be set to the grounding potential GND (i.e., the reference potential V00).

For example, as illustrated in FIG. 6B, the erasing voltage Vera increases from the reference potential V00, is maintained for a constant amount of time at a maximum value, and subsequently decreases to return to the reference potential V00. Slightly after the start of the increase of the erasing voltage Vera, the erasing selection gate voltage VeraG increases from the reference potential V00, is maintained for a constant amount of time at a maximum value less than the erasing voltage Vera, and subsequently decreases to return to the reference potential V00 slightly prior to the ramp-down of the erasing voltage Vera. Slightly after the start of the increase of the erasing selection gate voltage VeraG, the erasing back gate voltage VeraNS increases from the reference potential V00, is maintained for a constant amount of time at a maximum value less than the erasing selection gate voltage VeraG, and subsequently decreases to return to the reference potential V00 slightly prior to the ramp-down of the erasing selection gate voltage VeraG. On the other hand, the potential of the electrode films WL is constant at the reference potential V00. In the case where the potential of the back gate BG is the reference potential V00, the potential of the back gate BG is constant at the reference potential V00.

In the erasing operation of the comparative example, the reference potential V00 is applied simultaneously to the electrode films WL of the multiple memory cells arranged in the Z-axis direction of the semiconductor pillar (the first semiconductor pillar SP1 and the second semiconductor pillar SP2). Thereby, electron holes are injected into the memory regions of the memory layers of the memory cells formed at the intersections between the electrode films WL and the first semiconductor pillar SP1 and between the electrode films WL and the second semiconductor pillar SP2 to perform the erasing.

Figure 7:
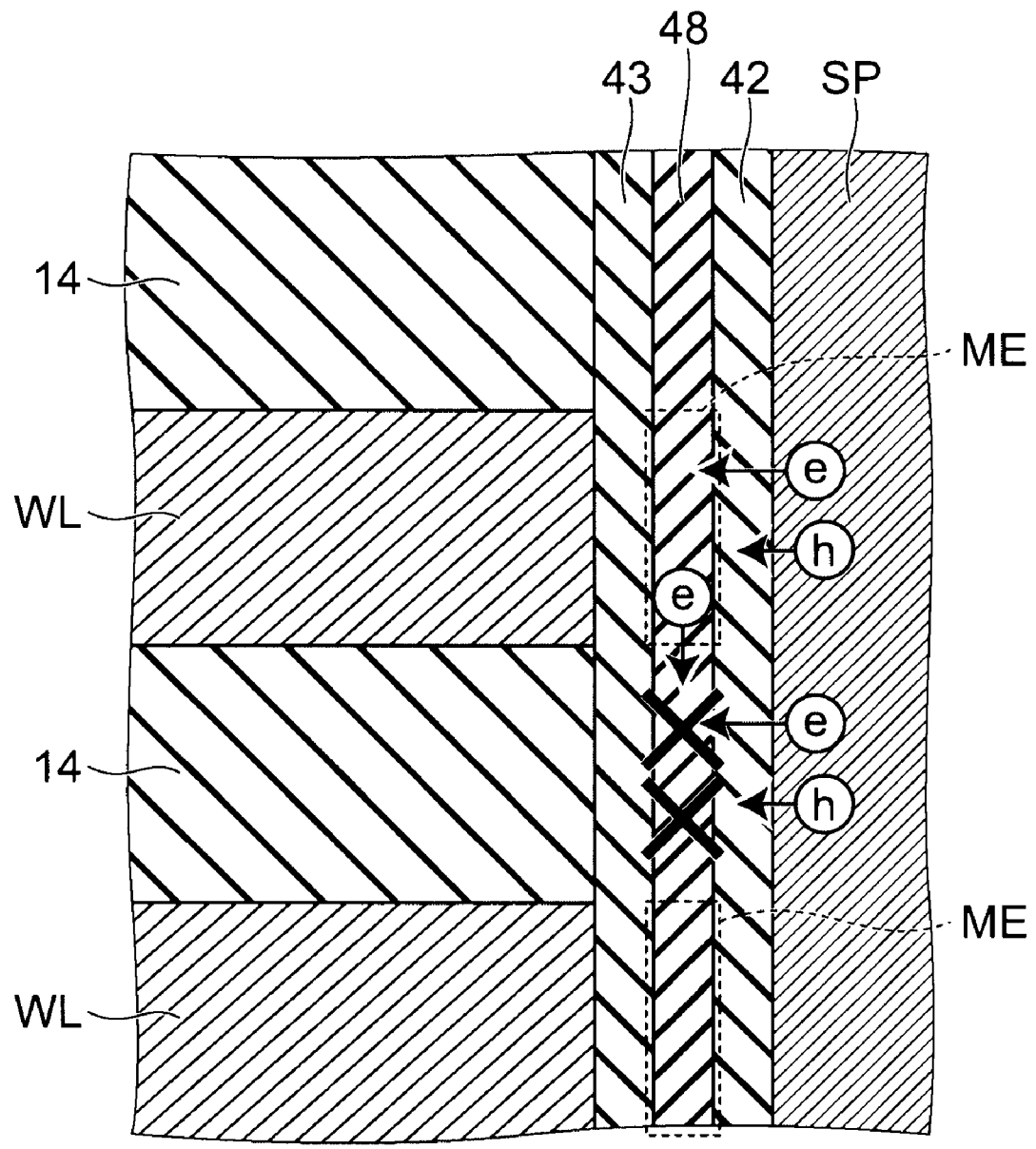
FIG. 7 is an enlarged view of memory cell portions.

FIG. 7 is an enlarged view of memory cell portions. Here, only the portions of the memory cells corresponding to two electrode films WL on one side of one semiconductor pillar SP are illustrated. The movement of the electrons and the electron holes are illustrated schematically.

In one memory cell, the charge storage film 48 at the position of the electrode film WL is a memory region ME. The programming is performed by performing at least one selected from injecting electrons into the memory region ME and removing electron holes from the memory region ME. In the example illustrated in FIG. 7, electrons are injected into the memory region ME in the programming.

In the erasing operation, at least one selected from injecting electron holes into the memory region ME of the charge storage film 48 and removing electrons from the memory region ME of the charge storage film 48 is performed. In the example illustrated in FIG. 7, electron holes are injected into the memory region ME in the erasing operation.

In such programming and erasing of the memory region ME, voltages corresponding to the programming and the erasing are applied between the electrode films WL and the semiconductor pillar which is used as the channel layer to control the injection of electrons into the memory region ME and the injection of electron holes into the memory region ME.

Here, it is conceivable that the electric fields due to the voltage application of the programming operation and the erasing operation may affect not only the memory region ME interposed between the electrode film WL and the channel layer but also may affect the inter-electrode insulating film 14 interposed between the electrode film WL and the electrode film WL.

Particularly because the voltage applied in the erasing operation is larger than that of the programming operation, electron holes easily pass through the inner insulating film 42 from the channel layer to be injected into the charge storage film 48 between the inter-electrode insulating film 14 and the channel layer, which may cause the occurrence of defects (states) in the charge storage film 48 between the inter-electrode insulating film 14 and the channel layer. Because the charge storage film 48 between the inter-electrode insulating film 14 and the channel layer is linked to the memory region ME, the occurrence of such defects may cause deterioration of the data retention due to movement of electrons stored in the memory region ME.

Figure 8A:
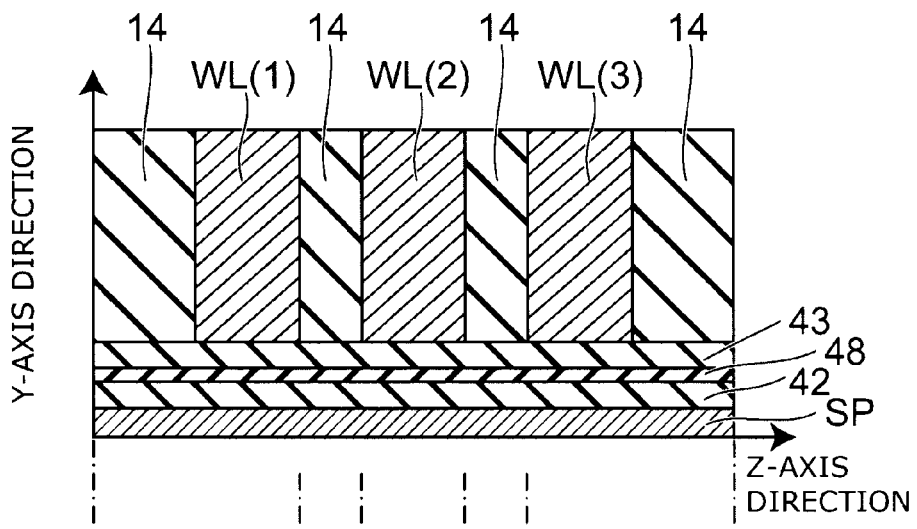
FIG. 8A is a schematic view illustrating the arrangement.
Figure 8B:
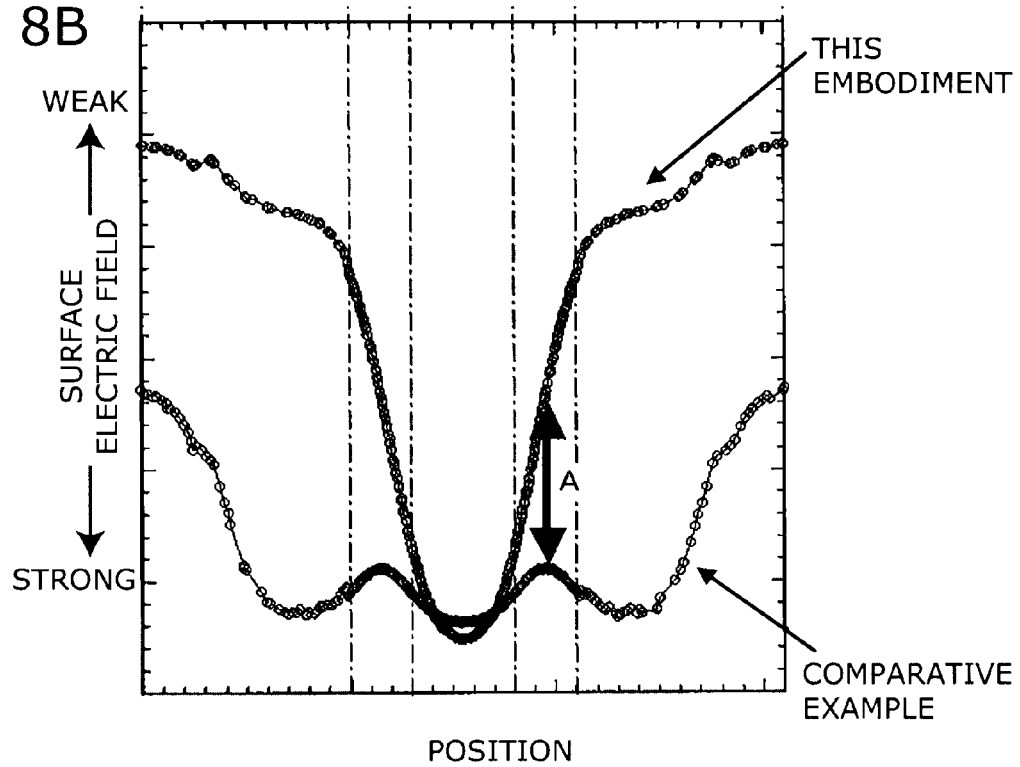
FIG. 8B illustrates simulation results of the electric field distribution.

FIGS. 8A and 8B are graphs illustrating the electric field distribution of the channel layer surface in the erasing operation. FIG. 8A is a schematic view illustrating the arrangement of three electrode films WL; and FIG. 8B illustrates simulation results of the electric field distribution when a voltage is applied between the electrode films WL and the channel layer of the semiconductor pillar SP of FIG. 8A. The horizontal direction of FIG. 8A and the horizontal axis of FIG. 8B illustrate the Z-axis direction position of the channel layer. The electric field distributions of the comparative example and this embodiment are illustrated in FIG. 8B.

In the electric field distribution of the comparative example, a constant potential difference (e.g., −20 V) occurs between the channel layer and all of the electrode films WL(1) to (3). In such a case, the potential difference between the inter-electrode insulating film 14 and the channel layer is nearly the potential difference between the electrode films WL and the channel layer. It can be seen that the electric field between the electrode films WL and the channel layer also has an effect between the inter-electrode insulating films 14 and the channel layer.

On the other hand, in the electric field distribution of this embodiment, of the three electrode films WL(1) to (3) illustrated in FIG. 8A, the reference potential V00 is applied to the electrode film WL(2) at the center; and the intermediate voltage Vm is applied to the electrode films WL(1) and (3) adjacent thereto. Thereby, although a constant potential difference (e.g., −20 V) occurs between the electrode film WL(2) and the channel layer, the potential difference between the adjacent electrode films WL(1) and (3) and the channel layer is less than the potential difference between the electrode film WL(2) and the channel layer by an amount of the intermediate voltage Vm.

Accordingly, arrow A of FIG. 8B illustrates the difference between the comparative example and this embodiment regarding the potential difference between the inter-electrode insulating film 14 and the channel layer. In other words, the difference illustrated by arrow A is the difference of the electric field stress between the inter-electrode insulating film 14 and the channel layer in the erasing operation; and the electric field stress between the inter-electrode insulating film 14 and the channel layer in the erasing operation is small in this embodiment which has a smaller potential difference than the comparative example.

Because the electric field stress to the charge storage film 48 between the inter-electrode insulating film 14 and the channel layer such as that recited above accumulates when the erasing operation of the nonvolatile semiconductor memory device is repeated, the difference of the accumulation of the stress due to repeated erasing operations appears markedly in the case where the electric field stress is lower than that of the comparative example as in this embodiment.

Accordingly, compared to the comparative example, the nonvolatile semiconductor memory device 110 according to this embodiment can suppress the accumulation of the electric field stress to the charge storage film 48 between the inter-electrode insulating film 14 and the channel layer and improve the data retention characteristics.

Drive Circuit Configuration

Figure 9:
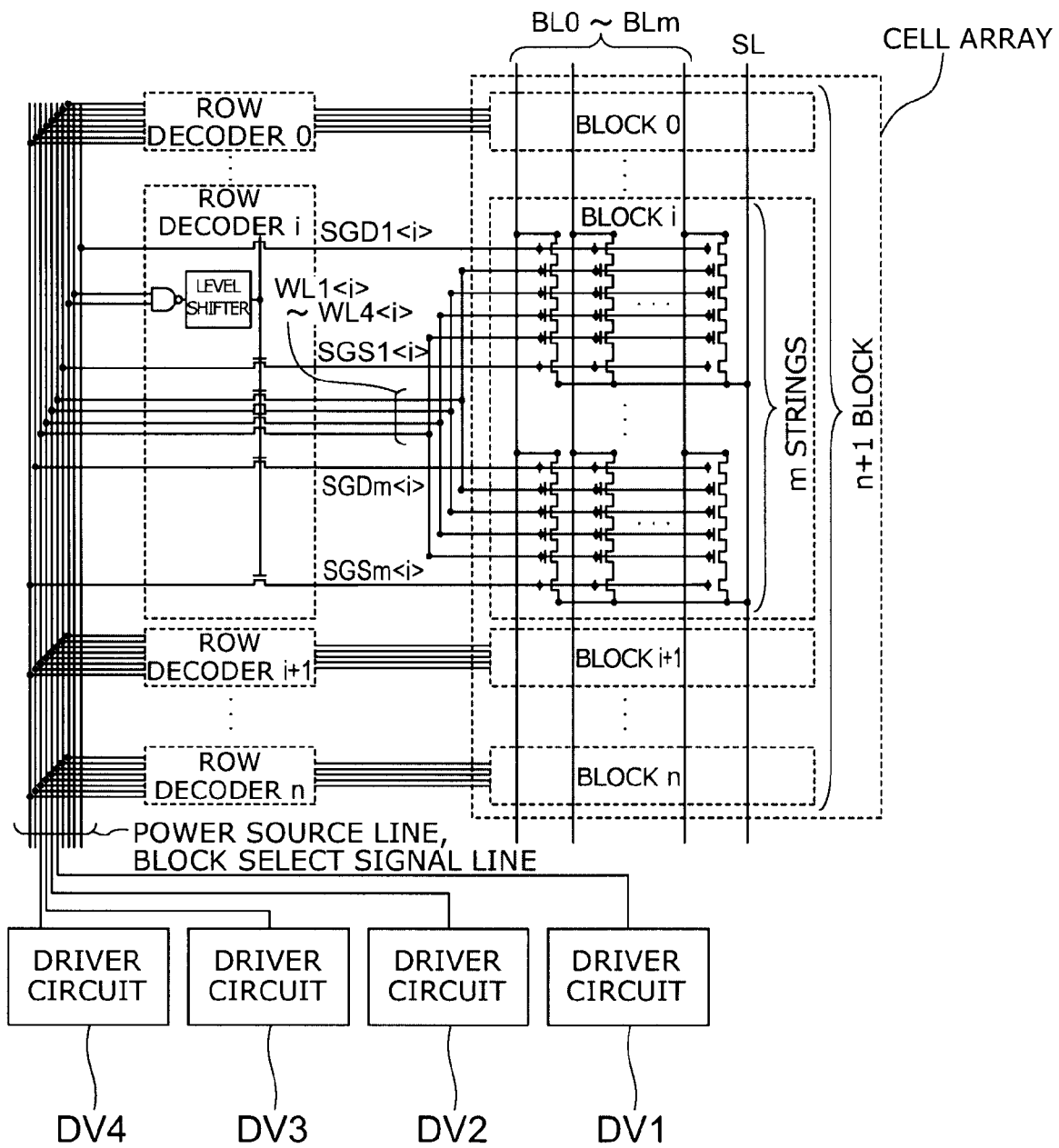
FIG. 9 is a circuit diagram illustrating a drive circuit configuration of the nonvolatile semiconductor memory device according to this embodiment.

FIG. 9 is a circuit diagram illustrating a drive circuit configuration of the nonvolatile semiconductor memory device according to this embodiment. In other words, the nonvolatile semiconductor memory device includes a cell array and decoders. The cell array includes n blocks (n being an integer not less than 1) including m strings (m being an integer not less than 1). The decoders are the row decoders; a decoder is provided every block of the cell array; and n decoders are provided. That is, a row decoder 0 is provided corresponding to a block 0, a row decoder 1 is provided corresponding to a block 1, . . . , a row decoder i is provided corresponding to a block i, . . . , and a row decoder n is provided corresponding to a block n.

The row decoder i connected to the block i provides signals SGD1<i> to SGDm<i> to the drain-side selection gate electrodes SGD of the m strings of the block i and provides the signals SGS1<i> to SGSm<i> to the source-side selection gate electrodes SGS. The row decoder i provides signals to the electrode films WL of the block i in the unit of layers. Because there are four layers of electrode films WL in the example illustrated in FIG. 9, signals WL1<i> to WL4<i> are provided. The row decoders other than the row decoder i also have similar configurations; and signals similar to those recited above are applied to the corresponding blocks.

Bit lines BL0 to BLm have common connections to the m strings of each of the blocks for the blocks 0 to n of the cell array; and the source line SL has a common connection to the blocks.

Driver circuits DV1 to DV4 control the signals sent to the bit lines BL0 to BLm and the source line SL and control the row decoders. The driver circuits DV1 to DV4 are circuits configured to control the signals WL1<i> to WL4<i> of each of the blocks 0 to n. The driver circuit DV1 controls the signal WL1<i> of each of the blocks 0 to n; the driver circuit DV2 controls the signal WL2<i> of each of the blocks 0 to n; the driver circuit DV3 controls the signal WL3<i> of each of the blocks 0 to n; and the driver circuit DV4 controls the signal WL4<i> of each of the blocks 0 to n. The signals output from the driver circuits DV1 to DV4 are sent to the signals WL1<i> to WL4<i> of each of the blocks 0 to n via the row decoders 0 to n, respectively.

The driver circuit may be provided in the same chip as the nonvolatile semiconductor memory device or may be provided outside the chip.

In the nonvolatile semiconductor memory device according to this embodiment, the voltage applied in the erasing to the multiple electrode films WL of the semiconductor pillar is applied at different timing to the electrode films WL adjacent in one direction of the same semiconductor pillar. In the example illustrated in FIG. 9, the signals WL1<i> to WL4<i> to the electrode films WL sent from each of the row decoders 0 to n to each of the blocks 0 to n are controlled such that the reference potential V00 is applied to adjacent electrode films WL at different timing by instructions from the driver circuits DV1 to DV4.

Although the embodiments described above are examples in which the nonvolatile semiconductor memory device mainly includes a NAND string having a U-shaped configuration in which two semiconductor pillars are connected by a connection portion, this may be applied also to a nonvolatile semiconductor memory device which has no connection portion and includes NAND strings having I-shaped configurations in which each of the semiconductor pillars is independent.

This is applicable not only to the configuration in which a stacked structural body including the electrode film WL alternately stacked with the inter-electrode insulating film 14 is pierced by semiconductor pillars but also to, for example, a planar nonvolatile semiconductor memory device having a MONOS structure in which multiple memory regions are provided in a continuous memory layer having a planar configuration and electrode portions are formed in the memory regions with an insulating film interposed therebetween.

A planar nonvolatile semiconductor memory device may have a configuration in which the memory layers are provided two-dimensionally (in the X-Y plane) and multiple memory regions are disposed in a matrix configuration at a prescribed spacing. In such a case, electrodes are provided corresponding to the memory regions. To apply the invention to such a structure, it is sufficient for the reference potential V00 that selects the cells to be erased in the erasing operation to be applied at different timing to the electrodes adjacent along the X-axis direction, the Y-axis direction, or both the X-axis direction and the Y-axis direction. The electrodes for the cells not to be erased may be floating or provided with a fixed potential such as the intermediate potential Vm and the like. From the viewpoint of reliably preventing erroneous erasing, it is desirable to apply a fixed potential such as the intermediate potential Vm and the like.

In the nonvolatile semiconductor memory device according to this embodiment, the inter-electrode insulating film 14, the inner insulating film 42, and the outer insulating film 43 may include a single-layer film of one selected from the group consisting of silicon oxide, silicon nitride, silicon oxynitride, aluminum oxide, aluminum oxynitride, hafnia, hafnium aluminate, hafnia nitride, hafnium nitride aluminate, hafnium silicate, hafnium nitride silicate, lanthanum oxide, and lanthanum aluminate or a stacked film made of a plurality selected from the group.

The charge storage film 48 may include a single-layer film of one selected from the group consisting of silicon nitride, silicon oxynitride, aluminum oxide, aluminum oxynitride, hafnia, hafnium aluminate, hafnia nitride, hafnium nitride aluminate, hafnium silicate, hafnium nitride silicate, lanthanum oxide, and lanthanum aluminate or a stacked film made of a plurality selected from the group.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the invention is not limited to these specific examples. For example, one skilled in the art may similarly practice the invention by appropriately selecting specific configurations of components included in nonvolatile semiconductor memory devices such as semiconductor substrates, electrode films, insulating films, insulating layers, stacked structural bodies, memory layers, charge storage films, semiconductor pillars, word lines, bit lines, source lines, interconnects, memory cell transistors, selection gate transistors, and the like from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all nonvolatile semiconductor memory devices practicable by an appropriate design modification by one skilled in the art based on the nonvolatile semiconductor memory devices described above as embodiments of the invention also are within the scope of the invention to the extent that the purport of the invention is included.

Furthermore, various modifications and alterations within the spirit of the invention will be readily apparent to those skilled in the art. All such modifications and alterations should therefore be seen as within the scope of the invention. For example, additions, deletions, or design modifications of components or additions, omissions, or condition modifications of processes appropriately made by one skilled in the art in regard to the embodiments described above are within the scope of the invention to the extent that the purport of the invention is included.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention claimed is:

1. A nonvolatile semiconductor memory device, comprising a memory unit and a control unit,
   the memory unit including:
   a charge storage film;

a first insulating film provided adjacent to one surface of the charge storage film;
a second insulating film provided adjacent to one other surface of the charge storage film;
a semiconductor portion provided adjacent to the first insulating film; and
a plurality of electrode portions provided adjacent to the second insulating film;
the control unit performing a control of applying a first voltage to electrode portions adjacent to each other in one direction at different timing respectively when performing an erasing operation of performing at least one selected from injecting electron holes into the charge storage film and removing electrons from the charge storage film, the first voltage being applied from one of the electrode portions to the charge storage film to be erased;
wherein
the plurality of electrode portions are stacked with an interposed inter-electrode insulating film, and
the charge storage film, the first insulating film, the second insulating film, and the semiconductor portion are provided in a hole piercing a structural body along a direction of the stacking, the structural body including the plurality of electrode portions stacked with the interposed inter-electrode insulating film.

2. The device according to claim 1, wherein
the charge storage film, the first insulating film, the second insulating film, and the semiconductor portion are formed in each of a plurality of holes piercing the structural body along the direction of the stacking, and
the charge storage film, the first insulating film, the second insulating film, and the semiconductor portion formed in each of two holes selected from the plurality of holes are connected to each other respectively via a connection portion at one end side of the two holes.

3. The device according to claim 1, wherein the control unit performs a control of applying a second voltage different from the first voltage to one other electrode portion of the adjacent electrode portions when applying the first voltage to one electrode portion of the adjacent electrode portions.

4. The device according to claim 1, wherein the control unit performs a control of applying the first voltage to one group of every other one of the plurality of electrode portions and to one other group of every other one of the plurality of electrode portions at different timing respectively.

5. The device according to claim 3, wherein the second voltage is a potential between the first voltage and a voltage used for erasing applied to the charge storage film.

6. The device according to claim 1, further comprising:
a plurality of transistors provided at intersection portions between the semiconductor portion and the plurality of electrode portions; and
a selection transistor configured to select the plurality of transistors,
the control unit performing a control of applying a selection gate voltage to the selection transistor slightly later than a start of an application of a voltage used for the erasing when performing the erasing operation.

7. The device according to claim 6, further comprising:
a connection portion provided in the semiconductor portion; and
a back gate provided to oppose the connection portion,
the control unit performing a control of applying a back gate voltage lower than the selection gate voltage to the back gate when performing the erasing operation.

8. The device according to claim 7, wherein the control unit performs the control of applying the back gate voltage slightly later than a start of the application of the selection gate voltage.

9. A method for driving a nonvolatile semiconductor memory device, the device including:
a charge storage film;
a first insulating film provided adjacent to one surface of the charge storage film;
a second insulating film provided adjacent to one other surface of the charge storage film;
a semiconductor portion provided adjacent to the first insulating film; and
a plurality of electrode portions provided adjacent to the second insulating film,
the method comprising:
applying a first voltage to electrode portions adjacent to each other in one direction at different timing respectively when performing an erasing operation of performing at least one selected from injecting electron holes into the charge storage film and removing electrons from the charge storage film, the first voltage being applied from one of the electrode portions to the charge storage film to be erased;
wherein a second voltage different from the first voltage is applied to one other electrode portion of the adjacent electrode portions when applying the first voltage to one electrode portion of the adjacent electrode portions.

10. The method according to claim 9, wherein the first voltage is applied to one group of every other one of the plurality of electrode portions and to one other group of every other one of the plurality of electrode portions at different timing respectively when performing the erasing operation.

11. The method according to claim 9, wherein the second voltage is a potential between the first voltage and a voltage used for erasing applied to the charge storage film.

12. The method according to claim 9, wherein
the nonvolatile semiconductor memory device further includes:
a plurality of transistors provided at intersection portions between the semiconductor portion and the plurality of electrode portions; and
a selection transistor configured to select the plurality of transistors,
a selection gate voltage being applied to the selection transistor slightly later than a start of an application of a voltage used for the erasing when performing the erasing operation.

13. The method according to claim 12, wherein
the nonvolatile semiconductor memory device further includes:
a connection portion provided in the semiconductor portion; and
a back gate provided to oppose the connection portion,
a back gate voltage lower than the selection gate voltage being applied to the back gate when performing the erasing operation.

14. The method according to claim 13, wherein the back gate voltage is applied slightly later than a start of the application of the selection gate voltage.

* * * * *